United States Patent
Thallner

(10) Patent No.: US 8,212,989 B2
(45) Date of Patent: Jul. 3, 2012

(54) DEVICE FOR TRANSFERRING STRUCTURES WHICH ARE PROVIDED IN A MASK ONTO A SUBSTRATE

(76) Inventor: Erich Thallner, St. Florian (AT)

(*) Notice: Subject to any disclaimer, the term of this patent is extended or adjusted under 35 U.S.C. 154(b) by 594 days.

(21) Appl. No.: 12/115,587

(22) Filed: May 6, 2008

(65) Prior Publication Data

US 2008/0284999 A1 Nov. 20, 2008

(30) Foreign Application Priority Data

May 14, 2007 (DE) .................. 10 2007 022 895

(51) Int. Cl.
    *G03B 27/42* (2006.01)
(52) U.S. Cl. .................. 355/53; 355/55; 355/72
(58) Field of Classification Search .............. 355/53, 355/55, 72
    See application file for complete search history.

(56) References Cited

U.S. PATENT DOCUMENTS

| | | | |
|---|---|---|---|
| 5,594,526 A | 1/1997 | Mori et al. | 355/77 |
| 6,774,983 B2 | 8/2004 | Kuchibhotla | 355/67 |
| 7,158,237 B2 | 1/2007 | Schriever et al. | 356/515 |
| 2001/0019404 A1* | 9/2001 | Schuster et al. | 355/67 |
| 2002/0176166 A1* | 11/2002 | Schuster | 359/494 |
| 2005/0002007 A1* | 1/2005 | Otomo | 355/67 |
| 2005/0219493 A1* | 10/2005 | Oshida et al. | 355/67 |
| 2006/0007414 A1* | 1/2006 | Luttikhuis et al. | 355/30 |

FOREIGN PATENT DOCUMENTS

WO  WO 2006/064363 A1  6/2006

* cited by examiner

*Primary Examiner* — Edward Glick
*Assistant Examiner* — Mesfin T Asfaw
(74) *Attorney, Agent, or Firm* — Kusner & Jaffe

(57) ABSTRACT

The invention concerns a device for transferring structures which are provided in a mask onto a substrate,
  with at least one illumination device, for homogeneous illumination of a section of the mask, and
  with a mask holding device, for holding a mask in a mask plane which is defined by an X axis and a Y axis which is perpendicular to it, and
  with at least one lens device, which is arranged on the side of the mask plane facing away from the illumination device, for mapping the structures onto the substrate, and
  with a substrate holding device, for holding the substrate in a substrate plane which is parallel to the mask plane and at a distance from the lens device, and
  with means for synchronous movement of the illumination device and lens device in parallel, relative to the mask plane and substrate plane, along the X axis and/or along the Y axis.

18 Claims, 1 Drawing Sheet

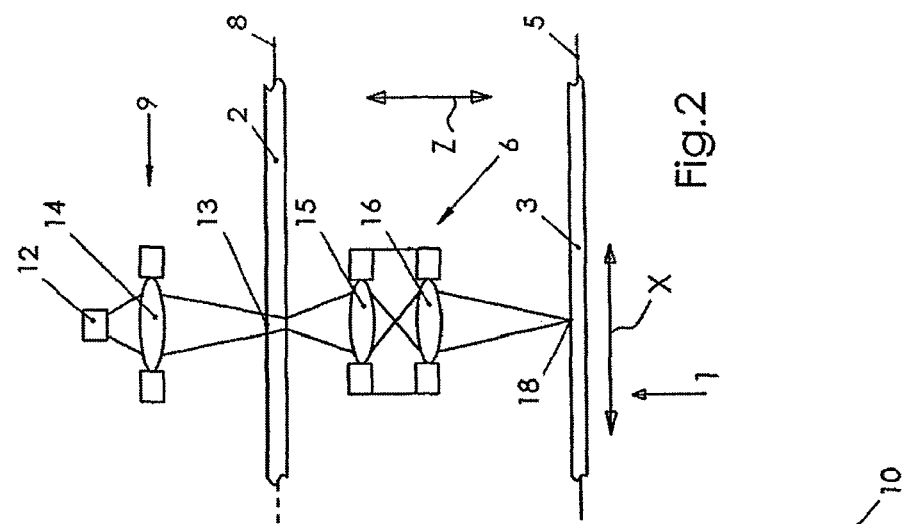
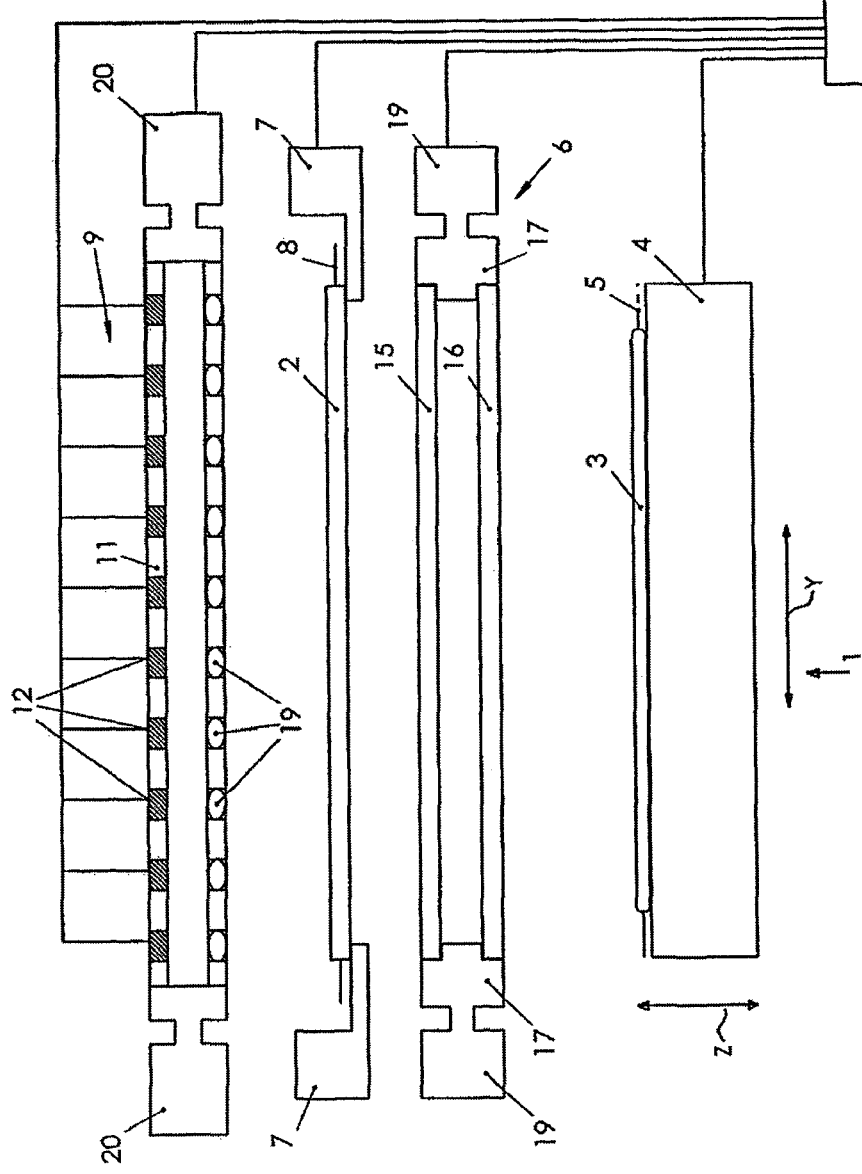

DEVICE FOR TRANSFERRING STRUCTURES WHICH ARE PROVIDED IN A MASK ONTO A SUBSTRATE

FIELD OF THE INVENTION

The invention concerns a device for transferring structures which are provided in a mask onto a substrate.

BACKGROUND OF THE INVENTION

In semiconductor technology, transferring structures from a mask onto a substrate, in particular a wafer, is an important step in the production of semiconductor components. Various technologies for transferring the structures are known.

Among the oldest technologies for transferring structures onto a substrate are contact lithography and proximity lithography. With contact lithography, typically resolutions of 0.8 μm can be achieved, and with proximity lithography, resolutions of as little as about 2.0 μm can be achieved.

However, most widely distributed are so-called steppers, with which structure precisions of as little as 0.1 μm or less can be achieved. However, steppers are expensive to buy.

Today, carrying out structure transfers in a range from about 0.8 μm to about 4.0 μm or above inexpensively and technically perfectly is a problem, in particular in the production of MEMS (micro-electro-mechanical systems). In principle, these structures could also be transferred by means of a stepper—but, as mentioned, this is extremely expensive. So-called mask aligners are less suitable for this resolution range.

The invention is therefore based on the object of proposing a simply constructed, inexpensive device with which structures from a resolution range between about 0.4 μm and about 4.0 μm or above can be transferred onto a substrate, in particular a wafer. Preferably, it should be possible to achieve a high substrate throughput with the device.

SUMMARY OF THE INVENTION

This invention is achieved with the features of the claims. Advantageous further developments of the invention are given in the subclaims. The scope of the invention also includes all combinations of at least two features which are given in the description, the claims and/or the figures. Where value ranges are given, the intention is to disclose also values within the stated limits as limit values, and to claim them in any combination.

The invention is based on the idea of arranging a mask, the structures of which are to be transferred onto a substrate, in particular a wafer which is coated with a photosensitive lacquer, along a Z axis between an illumination device and a lens device, the lens device in turn being arranged along the Z axis between the mask and the substrate. The core idea of the invention is to position the illumination device and lens device synchronously, relative to the mask and substrate, along an X axis or Y axis, in particular transversely to a longitudinal extent of the illumination device and lens device. In this way, it is possible to provide the whole substrate with a structure, in one continuous exposure process. For this purpose, preferably the size of the mask corresponds at least approximately to the size of the substrate. Also, advantageously, both the illumination device and the lens device, which is at a distance from it along the Z axis, extend at least approximately over the whole substrate. The exposure duration, and with it the exposure intensity, can be regulated by varying the synchronous motion speed of the illumination device and lens device. For instance, the synchronous motion of the illumination device and lens device can be implemented by a positioning drive, in particular a stepping motor, being associated with each of the illumination device and lens device, and being controlled synchronously by a control unit. Alternatively, it is conceivable to couple the illumination device and lens device permanently mechanically to each other, and to provide a common positioning drive, a control unit to regulate the illumination intensity being advantageously able to regulate the positioning speed. To achieve an even transfer of the structure of the mask onto the substrate, the illumination device must be in such a form that a (migrating) section of the mask, in particular a mask section in the form of a strip, is illuminated homogeneously, i.e. an even illumination energy distribution on this mask section is achieved. The illumination device is preferably in such a form that from it parallel light strikes the mask, in particular the migrating mask section which is to be homogeneously illuminated. The illumination of the mask structure for optical mapping can also be oblique. On the other hand, the purpose of the lens device is to map, i.e. to focus, the mask structure, in particular the mask structure of the migrating, homogeneously illuminated mask section in each case, onto the substrate, which is at a distance from the lens device. Preferably, the lens unit is in such a form that a migrating mapping strip is made on the substrate. Advantageously, at least one diaphragm, in particular at least one field diaphragm, with which the peripheral areas of the (in particular strip-shaped) mapping on the substrate and/or the peripheral areas of the (in particular strip-shaped) illumination section on the mask can be shaded off as sharply as possible, is associated with the lens device and/or the illumination device, so that a defined exposure time and/or exposure intensity of the substrate can be achieved. However, the lens unit is also used to improve the mapping, among other ways by the optical beams being delimited definedly.

Advantageously, the illumination device is in such a form that the whole mask is not illuminated homogeneously, but that only an illumination strip, which preferably extends along the whole width of the substrate, and in which the illumination energy is at least approximately distributed evenly, i.e. homogeneously, is formed. To make the transfer process faster, it is possible to provide multiple illumination devices with associated lens devices, which can preferably be moved simultaneously along or parallel to the mask plane. Instead of a strip-shaped section with a significantly greater longitudinal than transverse extent, a different geometrical section shape can be chosen.

In a further development of the invention, surprisingly good illumination results were achieved by multiple LEDs being provided as the light source of the illumination device to illuminate a mask section. Preferably, the illumination intensity of each individual LED or group of LEDs is variable, to achieve even plotting of the light energy onto the mask section to be illuminated.

Preferably, the LEDs are arranged next to each other along the X axis and/or along the Y axis, preferably transversely to the common direction of motion of the illumination device and lens device.

To achieve homogeneous (in energy terms) illumination of a mask section, it has been shown to be advantageous if at least one lens unit, with at least one lens in each case, is associated with each LED or group of LEDs, in particular to generate a parallel light bundle. Preferably, the LEDs are each arranged in the focus of the associated lens. Advantageously, the lenses are cylindrical lenses.

For further equalisation of the illumination of the mask section, it has been shown to be advantageous to set the LEDs to oscillate, in particular transversely to the direction of motion of the illumination device.

As a further development of the invention, it is advantageously provided that the mask holding device has adjustment means for adjusting the mask. Preferably, the adjustment means are in the form of piezo positioning elements, with which the position of the mask relative to the substrate, in particular along the Z axis, can be varied. It is advantageous if the piezo positioning elements can be positioned both synchronously and individually, so that optimum adjustment of the relative position of the mask or mask sections can be implemented. Because the mask can be moved along the Z axis, the distance of the mask or mask sections from the lens device can be varied, which causes a change of the size of the mapping of the structures to be transferred. By adjusting the mask during the positioning of the illumination device and lens device, it is possible to compensate for distortions which would occur because of expansion of the substrate and/or mask, in particular because of temperature.

Preferably, the lens device is in such a form that it generates a strip-shaped mapping on the substrate. The strip-shaped mapping migrates because of the positioning motion of the illumination device and lens device along the substrate surface. Preferably, the lens device, which in particular extends over the whole substrate width, is provided with at least one diaphragm, to shade off peripheral areas of the mapping strip sharply.

In a further development of the invention, additionally or alternatively to the provision of adjustment means for the mask holding device, adjustment means for the lens device, with which the lens device can be affected so that the size of the mapping on the substrate and/or the focus position along the Z axis can be adjusted, are provided. Provision of such adjustment means is advantageous, because the mask and substrate expand with increasing temperatures. Preferably, the adjustment means are in such a form that the adjustment of the lens device can be adjusted depending on a temperature and/or depending directly on the change of length and/or thickness of the mask or substrate. Preferably, in the case of temperature-dependent regulation, the temperature of the mask and/or of the substrate is captured by means of a contactless temperature sensor. If required, the change of length and/or thickness can also be monitored directly, in particular optically. It should be mentioned here that in a further development of the invention, the adjustment means for the mask holding device can also be designed to work depending on the above-mentioned temperatures, and/or on the change of length and/or thickness of the mask and/or substrate. If required, corresponding adjustment means for adjusting the position of the substrate can also be provided.

Preferably, the adjustment means for the lens device are supplied so that with them the gap with reference to the Z axis between two lenses of the lens device is variable. This can be implemented by piezo positioning elements, for instance. By varying the gap between the lenses, it is possible to compensate for the distortions explained above.

As a further development of the invention, it is advantageously provided that the lens device includes aspherical cylindrical lenses and/or Cartesian oval lenses, the lenses preferably extending over the whole width of the substrate.

In a version of the invention, it is advantageously provided that the device includes a control unit, with which the exposure intensity, i.e. the exposure duration of the substrate, can be adjusted. Preferably, this is made possible by regulating the speed of the illumination device and lens device. Advantageously, with the control unit the illumination intensity of all LEDs can be regulated, and the adjustment means for the mask holding device and/or the lens device and/or the substrate holding device can be controlled.

Within the scope of the invention, multiple units consisting of an illumination device and a lens device, which can be moved independently of or coupled to each other along the X and/or Y axis, can be provided, to make the structure transfer process faster.

BRIEF DESCRIPTION OF THE DRAWINGS

Further advantages, features and details of the invention are given in the following description of preferred embodiments, and on the basis of the drawings, in which:

FIG. 1 shows, in a schematic representation, a side view of a device for transferring structures which are provided in a mask onto a substrate, and FIG. 2 shows a side view, rotated by 90°, of the device according to FIG. 1.

DETAILED DESCRIPTION OF PREFERRED EMBODIMENTS

In the figures, the same components and components with the same function are identified by the same reference symbols.

In FIGS. 1 and 2, a device 1 for transferring structures (not shown), which are provided in a mask 2, onto a substrate 3, in this case a wafer coated with photoresist, is shown.

The wafer 3 is arranged on a so-called substrate holding device (chuck) 4, the substrate holding device 4 being provided with adjustment means (not shown) for aligning the substrate 3 along a Z axis. The adjustment means consist advantageously of multiple individually controllable piezo positioning elements. The substrate 3 lies in a substrate plane 5, which is defined by an X axis and a Y axis.

At a distance from the substrate 3 along the Z axis, in the drawing plane above the substrate 3 and substrate holding device 4, is a lens device 6. The lens device 6 is received with reference to the Z axis between the substrate holding device 4 and a mask holding device 7 for the mask 2, which is in a mask plane 8. The substrate plane 5 and mask plane 8 are arranged parallel to each other (in the optimum case).

In the drawing plane above the mask 2, i.e. at an axial distance with reference to the Z axis from the mask 2, is an illumination device 9.

The device 1 also includes a control unit 10, the function of which is explained in the further course of the figure description.

The device 9 includes a bar 11 which extends along the Y axis, with multiple LEDs 12 arranged next to each other. Each LED 12 is connected to the control device 10, the control unit 10 regulating the supply of current to the LEDs and thus the illumination energy, in such a way that a homogeneous (in energy terms) illumination strip 13, which also extends along the Y axis, is formed on the mask 2. To equalise the illumination intensity of the illumination strip 13, a lens unit 14, consisting of one lens, is associated with each LED 12. Each LED 12 is in the focus of the associated lens unit 14, so that the light which strikes in the illumination strip 13 is parallel. On the side of the mask 2 facing away from the illumination device 9 is the lens device 6, which in the shown embodiment has two lenses 15, 16 (here aspherical cylindrical lenses) which extend along the Y axis and are at a distance in the axial direction along the Z axis. By means of the lens device 6, a strip-shaped mapping 18, which extends along the Y axis, is projected onto the substrate. Diaphragms which are used in the lens device 6, and in particular are arranged between the lenses to delimit the strip-shaped mapping 18 sharply, are not shown. Using adjustment means 17 (shown schematically), the axial distance along the Z axis between the lenses 15, 16 can be varied. To regulate the adjustment process, the adjustment means 17, which include piezo positioning elements (not shown), are connected to the control unit 10. The control unit 10 in turn is connected by signal lines to temperature sensors (not shown) to capture the substrate temperature and mask temperature, the adjustment of the lenses 15, 16 being regulated by the control unit 10 depending on the measured temperatures. Instead of providing piezo positioning elements, it is conceivable to arrange the lenses 15, 16 in a hermetically closed system, to enclose refraction-affecting fluids in this system, and by applying pressure or vacuum, to cause deformation of the lenses 15, 16 along the Z axis.

The mask holding device 7 is also connected to the control unit 10. The control unit 10 acts on adjustment means (not shown) of the mask holding device 7 to adjust, i.e. position, the mask 2 along the Z axis, the control unit 10 doing the adjustment depending on the mask temperature and substrate temperature.

To transfer the structure of the mask 2 onto the substrate 3, the lens device 6 and illumination device 9 are each moved by means of a positioning drive 19, 20 along the X axis, the positioning speeds of the positioning drives 19, 20 being synchronised by means of the control unit 10. By varying the common positioning speeds of the lens device 6 and illumination device 9 relative to the mask 2 and substrate 3, the exposure time of the substrate 3 can be varied.

Because of the lens device 6 and illumination device 9 being moved along the X axis, the strip-shaped mapping 18 migrates along the substrate 5, so that in one continuous operation, the whole substrate 3 is provided with a structure.

The width of the mapping 18, i.e. the extent of the mapping 18 along the X axis, can be enlarged by providing multiple LED bars and/or lens devices which are arranged next to each other along the X axis, resulting in a contour which is not strip-shaped. As well as this plane extent of the mapping 18 and illumination section 13, it is possible to arrange several of the shown units, each consisting of at least one illumination device 9 and one lens device 6, at a distance from each other, in which case the units can be moved, independently of each other or coupled, along the X axis, to make the mapping process faster.

The invention claimed is:

1. Device for transferring the shape of structures which are provided in a mask onto a substrate, the device comprising:
    at least one illumination device for homogeneous illumination of a section of the mask,
    a mask holding device for holding the mask in a mask plane which is defined by an X axis and a Y axis which is perpendicular to the X axis,
    at least one lens device which is arranged on the side of the mask plane facing away from the at least one illumination device, the at least one lens device for mapping the shape of structures in the mask onto the substrate,
    a substrate holding device for holding the substrate in a substrate plane which is parallel to the mask plane and at a distance from the at least one lens device, and
    synchronous movement means for synchronous movement of the at least one illumination device and the at least one lens device in a direction parallel to the mask plane and the substrate plane, the synchronous movement means moving the at least one illumination device and the at least one lens device in a direction parallel to the X axis and/or the Y axis of the mask plane.

2. Device according to claim 1, wherein the at least one illumination device is designed to generate a homogeneous (in energy terms) illumination strip in the mask plane.

3. Device according to claim 1, wherein the at least one illumination device includes multiple LED's.

4. Device according to claim 3, wherein the LED's are arranged next to each other along the X axis and/or along the Y axis.

5. Device according to claim 3, wherein a lens unit is associated with each LED or group of LED's.

6. Device according to claim 3, wherein the LED's can be put into an (in particular high-frequency) oscillation, preferably along the X axis or Y axis.

7. Device according to claim 1, wherein the mask holding device has adjustment means, in particular piezo positioning elements, to adjust the mask, in particular for positioning it, preferably by sections, along a Z axis, which runs perpendicularly to the X axis and Y axis.

8. Device according to claim 1, wherein the at least one lens device is designed to generate a mapping strip in the substrate plane.

9. Device according to claim 1, wherein the at least one lens device can be adjusted depending on a temperature, in particular the mask temperature and/or the mask environment temperature and/or the substrate temperature and/or the substrate environment temperature, and/or depending on the change of length and/or thickness of the mask and/or the substrate.

10. Device according to claim 1, wherein the at least one lens device includes at least two, in particular long stretched, lenses, which can be positioned relative to each other, preferably along the Z axis.

11. Device according to claim 10, wherein the lenses can be positioned relative to each other, in particular along the Z axis, depending on a temperature, in particular the mask temperature and/or the mask environment temperature and/or the substrate temperature and/or the substrate environment temperature.

12. Device according to claim 1, wherein the at least one lens device includes spherical cylindrical lenses and/or cartesian oval lenses.

13. Device according to claim 1, wherein the extent of the at least one illumination device and the at least one lens device along the X axis or along the Y axis corresponds at least approximately to the extent of the substrate along the corresponding axis.

14. Device according to claim 1, wherein a control unit, which is designed to set the exposure intensity of the substrate by adapting the motion speed of the at least one illumination device and the at least one lens device, is provided.

15. A device for transferring the shape of structures in a mask to a substrate, said device comprising:
    a mask holding device for holding the mask in a mask plane, said mask holding device having a first side and a second side, said first side being opposite said second side;
    at least one illuminating device for homogeneous illumination of a section of said mask, said at least one illumination device disposed adjacent to said first side of said mask holding device;
    at least one lens device associated with said at least one illumination device, said at least one lens device having a first side and a second side, said first side of said at least one lens device disposed adjacent to said second side of mask holding device; and a substrate holding device for holding the substrate in a substrate plane that is parallel to said mask plane, said substrate holding device disposed adjacent to said second side of said lens device, wherein said at least one illumination device moves in a synchronous manner with said at least one lens device in a plane parallel to said mask plane and said substrate plane.

16. A device for transferring the shape of structures in a mask to a substrate, said device comprising:

a mask holding device for holding said mask in a mask plane, said mask holding device having a first side and a second side, said first side being opposite said second side;

at least one illumination device for homogeneous illumination of a section of said mask, said at least one illumination device disposed adjacent to said first side of said mask holding device, said at least one illumination device including multiple LEDs wherein an illumination intensity of each individual LED or group of LEDs is variable;

at least one lens device associated with said at least one illumination device, said at least one lens device having a first side and a second side, said first side of said at least one lens device disposed adjacent to said second side of mask holding device; and a substrate holding device for holding said substrate in a substrate plane that is parallel to said mask plane, said substrate holding device disposed adjacent to said second side of said lens device, wherein said at least one illumination device moves in a synchronous manner with said at least one lens device in a plane parallel to said mask plane and said substrate plane.

17. Device for transferring the shape of structures which are provided in a mask onto a substrate, the device comprising:

at least one illumination device for homogeneous illumination of a section of the mask, a mask holding device for holding the mask in a mask plane which is defined by an X axis and a Y axis which is perpendicular to the X axis, at least one lens device which is arranged on the side of the mask plane facing away from the at least one illumination device, the at least one lens device for mapping the shape of structures in the mask onto the substrate, a substrate holding device for holding the substrate in a substrate plane which is parallel to the mask plane and at a distance from the at least one lens device, and synchronous movement means for synchronous movement of the at least one illumination device and the at least one lens device in a direction parallel to the mask plane and the substrate plane, the synchronous movement means moving the at least one illumination device and the at least one lens device in a direction parallel to the X axis and/or the Y axis of the mask plane, wherein the at least one lens device generates a mapping strip in the substrate plane.

18. Device according to claim 17, further comprising:

a control unit that monitors the temperature of the mask and/or the substrate and adjusts the position of the mask and/or the substrate based on the temperature of the mask and/or the substrate.

* * * * *